US009478441B1

(12) United States Patent
Sridevan

(10) Patent No.: US 9,478,441 B1
(45) Date of Patent: *Oct. 25, 2016

(54) METHOD FOR FORMING A SUPERJUNCTION DEVICE WITH IMPROVED RUGGEDNESS

(75) Inventor: Srikant Sridevan, Redondo Beach, CA (US)

(73) Assignee: SILICONIX TECHNOLOGY C. V., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/849,782

(22) Filed: Aug. 3, 2010

Related U.S. Application Data

(60) Continuation of application No. 11/586,901, filed on Oct. 26, 2006, now Pat. No. 7,767,500, which is a division of application No. 10/968,499, filed on Oct. 19, 2004, now Pat. No. 7,166,890.

(60) Provisional application No. 60/513,174, filed on Oct. 21, 2003.

(51) Int. Cl.
*H01L 21/425* (2006.01)
*H01L 21/38* (2006.01)

(52) U.S. Cl.
CPC ..................... *H01L 21/38* (2013.01)

(58) Field of Classification Search
CPC ............. H01L 21/041; H01L 21/0415; H01L 21/042; H01L 21/22; H01L 21/38
USPC ..................... 438/132, 439; 257/339, E29.06
See application file for complete search history.

(56) References Cited

U.S. PATENT DOCUMENTS

| 4,284,997 | A | 8/1981 | Nishizawa |
| 4,375,124 | A | 3/1983 | Cogan |
| 4,587,712 | A | 5/1986 | Baliga |
| 5,216,275 | A | 6/1993 | Chen |
| 5,365,085 | A | 11/1994 | Tokura et al. |
| 5,766,966 | A | 6/1998 | Ng |
| 6,040,600 | A | 3/2000 | Uenishi et al. |
| 6,140,679 | A | 10/2000 | Ferla et al. |
| 6,300,171 | B1 * | 10/2001 | Frisina ........................... 438/140 |
| 6,353,252 | B1 | 3/2002 | Yasuhara et al. |
| 6,410,958 | B1 | 6/2002 | Usui et al. |

(Continued)

FOREIGN PATENT DOCUMENTS

| DE | 19840032 | 11/1999 |
| JP | 11348355 | 6/2000 |

(Continued)

OTHER PUBLICATIONS

Translation of a portion of the Office Action for Japanese Patent Application No. 2004-306311; Issue Date Feb. 27, 2007.

(Continued)

*Primary Examiner* — Wael Fahmy
*Assistant Examiner* — Sarah Salerno

(57) ABSTRACT

An improved superjunction semiconductor device includes a charged balanced pylon in a body region, where a top of the pylon is large to create slight charge imbalance. A MOS-gated structure is formed over the top of the pylon and designed to conduct current through the pylon. By increasing a dimension of the top of the pylon, the resulting device is less susceptible to variations in manufacturing tolerances to obtain a good breakdown voltage and improved device ruggedness.

20 Claims, 2 Drawing Sheets

(56) References Cited

U.S. PATENT DOCUMENTS

| | | |
|---|---|---|
| 6,441,455 B1 | 8/2002 | Dutta |
| 6,465,843 B1 | 10/2002 | Hirler et al. |
| 6,498,368 B2 | 12/2002 | Sakamoto et al. |
| 6,509,240 B2 | 1/2003 | Ren et al. |
| 6,541,817 B1 | 4/2003 | Hurkx et al. |
| 6,605,862 B2 | 8/2003 | Van Dalen et al. |
| 6,621,122 B2 | 9/2003 | Qu |
| 6,630,698 B1 | 10/2003 | Deboy et al. |
| 6,639,272 B2 * | 10/2003 | Ahlers et al. ............... 257/328 |
| 6,674,126 B2 | 1/2004 | Iwamoto et al. |
| 6,683,347 B1 | 1/2004 | Fujihira |
| 6,700,141 B2 | 3/2004 | Iwamoto et al. |
| 6,713,813 B2 | 3/2004 | Marchant |
| 6,740,931 B2 | 5/2004 | Kouzuki et al. |
| 6,762,455 B2 | 7/2004 | Oppermann et al. |
| 6,764,906 B2 | 7/2004 | Darwish |
| 6,768,170 B2 | 7/2004 | Zhou |
| 6,828,609 B2 | 12/2004 | Deboy et al. |
| 6,849,900 B2 | 2/2005 | Aida et al. |
| 6,883,347 B2 | 4/2005 | Ayub |
| 6,979,862 B2 | 12/2005 | Henson |
| 7,166,890 B2 | 1/2007 | Sridevan |
| 7,492,003 B2 | 2/2009 | Kinzer |
| 7,659,588 B2 | 2/2010 | Husain et al. |
| 8,633,561 B2 | 1/2014 | Husain et al. |
| 2001/0052601 A1 | 12/2001 | Onishi et al. |
| 2002/0063281 A1 | 5/2002 | Tihanyl |
| 2003/0176031 A1 | 9/2003 | Onishi et al. |
| 2003/0219933 A1 | 11/2003 | Yamauchi et al. |
| 2004/0016959 A1 | 1/2004 | Yamaguchi et al. |
| 2004/0038467 A1 | 2/2004 | Darwish et al. |
| 2004/0108568 A1 * | 6/2004 | Qu ................. H01L 29/0634 257/500 |
| 2004/0150039 A1 | 8/2004 | Henson |
| 2004/0150040 A1 | 8/2004 | Nitta et al. |
| 2004/0227182 A1 | 11/2004 | Darwish et al. |
| 2004/0245570 A1 | 12/2004 | Ninomiya |
| 2005/0082570 A1 | 4/2005 | Sridevan |
| 2005/0133859 A1 | 6/2005 | Kuwahara et al. |
| 2005/0221547 A1 | 10/2005 | Yamauchi et al. |
| 2006/0131644 A1 | 6/2006 | Saito et al. |
| 2006/0226494 A1 | 10/2006 | Hshieh |
| 2006/0281249 A1 | 12/2006 | Yilmaz et al. |
| 2007/0048909 A1 | 3/2007 | Sridevan |
| 2007/0222025 A1 | 9/2007 | Husain et al. |
| 2009/0218617 A1 | 9/2009 | Kinzer |

FOREIGN PATENT DOCUMENTS

| | | |
|---|---|---|
| JP | 2001313391 | 11/2001 |
| JP | 2002076339 | 3/2002 |
| JP | 2005506715 | 5/2003 |
| JP | 2004072068 | 3/2004 |
| JP | 200374951 | 9/2004 |
| JP | 2004363498 | 12/2004 |
| JP | 200556912 | 3/2005 |
| JP | 2005175416 | 6/2005 |
| JP | 2006511974 | 4/2006 |
| WO | WO2004061975 | 7/2004 |
| WO | WO2006018820 | 2/2006 |
| WO | WO2006135746 | 12/2006 |
| WO | WO2008091269 | 7/2008 |

OTHER PUBLICATIONS

Analysis of the Effect of Charge Imbalance on the Static and Dynamic Characteristics of the Super Junction MOSFET, Praveen M. Shenoy, Anup Bhalla and Gary M. Dolny, pp. 99-102, 1999 IEEE.

Application As Filed; U.S. Appl. No. 60/761,701; Daniel M. Kinzer; Filed on Jan. 24, 2006.

Simulated Superior Performances of Semiconductor Superjuction Devices, Tatsuhiko Fujihira and Yasushi Miyasaka, Proceedings of 1998 Intellectual Symposium on Power Semiconductor Devices & ICS, Kyoto.

* cited by examiner

METHOD FOR FORMING A SUPERJUNCTION DEVICE WITH IMPROVED RUGGEDNESS

CROSS-REFERENCE TO RELATED APPLICATIONS

This application is a continuation and claims a benefit and priority to a U.S. patent application Ser. No. 11/586,901, filed on Oct. 26, 2006, entitled SUPERJUNCTION DEVICE WITH IMPROVED RUGGEDNESS, assigned to the same assignee, the U.S. patent application Ser. No. 11/586,901 is a divisional and claims a benefit and priority to U.S. patent application Ser. No. 10/968,499, filed Oct. 19, 2004, entitled SUPERJUNCTION DEVICE WITH IMPROVED RUGGEDNESS, which claims the benefit and priority to U.S. Provisional Application Ser. No. 60/513,174, filed Oct. 21, 2003, entitled SUPERJUNCTION DEVICE WITH IMPROVED RUGGEDNESS, all of which are incorporated herein by reference.

FIELD OF THE INVENTION

This invention relates to superjunction devices and a process for their manufacture, and more specifically to the increase of the ruggedness of superjunction devices, and the increase of the process window tolerances for such devices.

BACKGROUND OF THE INVENTION

Superjunction devices possess the advantage of significantly reduced for the same high breakdown voltage (BV) of a conventional MOSFET. The superjunction is comprised of a multi-layer, for example, a six-layer sequence of implant and epitaxy to form spaced P-columns which is used to balance the charge in the N type drift region epi which receives the columns. The same reticle is used repetitively on the six layers to generate the P-column.

The charge balance is critical with a small process window. Exceeding this window on the P-type side (that is, having an excessive P charge in the P columns) leads to the BV falling below the spec. Exceeding this window on the N-type side leads to high BV but can lead to ruggedness reduction.

Device ruggedness can be enhanced by structural modifications that force the current to flow through the P-column rather than outside it. Such structures are shown in copending application Ser. No. 60/417,212, filed Oct. 8, 2002 and assigned to the assignee of the present invention, and which is incorporated herein by reference. In that case, the top-most portion only of the P columns had a higher and unbalanced P concentration (charge) than the remainder of the columns, which have a balanced concentration against the surrounding N type body. This caused avalanche current at the top of the columns to be diverted from under the MOSFET source regions (the $R_b'$ region) and toward the axis of the column.

BRIEF DESCRIPTION OF THE INVENTION

The invention proposes a different modification. Instead of using the same design for all the layers, the topmost layer design is modified with a slightly larger feature (diameter) and thus increased volume and P charge, solely in the active area such that the BV of the active area cells is reduced selectively and also so that the current flows into or toward the axis of the P column, thus improving the ruggedness. The lower 5 layers and the termination can then be optimized for maximum BV. The use of the separate upper or $6^{th}$ layer design will allow the realization of high termination BV, relatively lower active area BV and current flow in the P-column. The conjunction of these 3 factors will improve the ruggedness and increase the process window tolerance since it reduces the dependence of the EAS on the device BV. Note that while a six layer design has been chosen to illustrate the invention, any number of layers can be used.

DETAILED DESCRIPTION OF THE INVENTION

Figure 1:
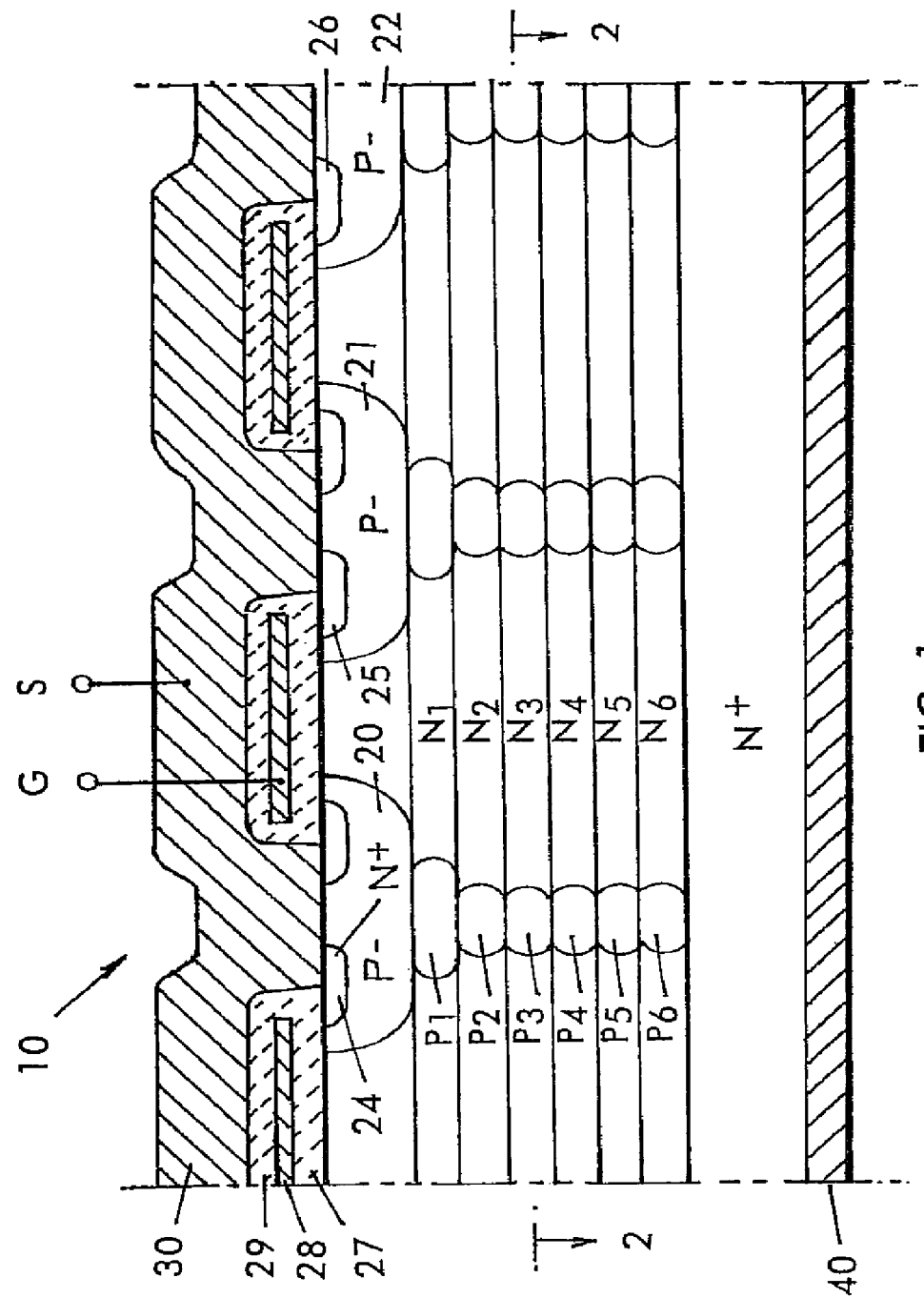
FIG. 1 is a cross-section of a small portion of the active area of a superjunction device, which employs the present invention.
Figure 2:
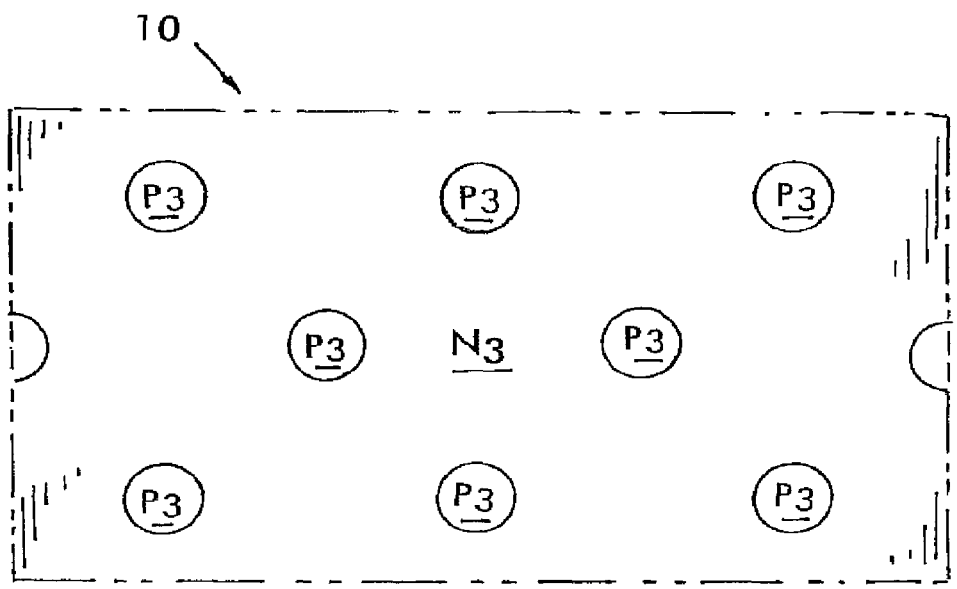
FIG. 2 is a cross-section of FIG. 1 taken across section line 2-2 in FIG. 1.
Figure 3:
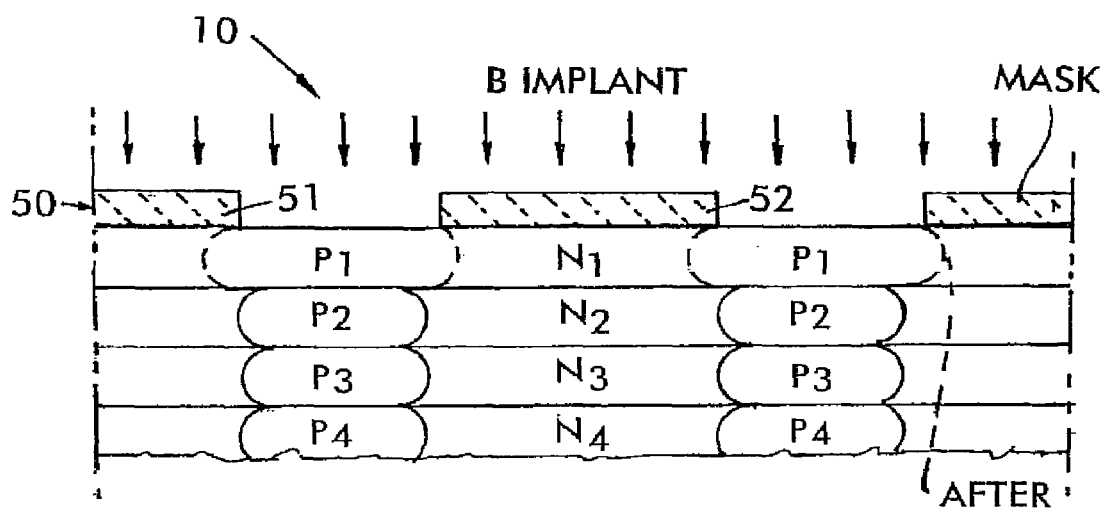
FIG. 3 shows the process step of forming an enlarged volume P section at the top of the P columns in accordance with the invention.

Referring to FIGS. 1 to 3, a silicon wafer (sometimes referred to as a die or chip) is formed of an $N^+$ wafer 10 which receives a series of epitaxial layers $N_6$ to $N_1$ which are sequentially formed. After the formation of each layer, an implant and diffusion is carried out to form P regions ($P_6$ to $P_1$ respectively). In the prior art, the implant and diffusions are identical in size and concentration and which are charge balanced to the surrounding charge of layers $N_6$ to $N_1$ respectively, which are each of the same concentrations.

Each of P regions $P_6$ to $P_1$ are aligned to one another to form a continuous column or "pylon".

A MOSgated structure is then formed atop each column, shown in FIG. 1 as P channel regions 20, 21 and 22 which conventionally receive $N^+$ source regions 24, 25 and 26 respectively. A gate oxide 27 is deposited over the inversion areas of each of channel regions 20, 21 and 26 respectively and a conductive polysilicon gate 28 is formed over each of gate oxide regions 27. An LTO insulation layer 29 is formed over gates 28 and a source electrode 30 is formed over the layer 29 and contacts each of sources 24, 25, 26 and the inner channel of regions 20, 21 and 22. Note that the channel regions 20, 21 and 22 may be polygonal cells or stripes; and columns $P_6$ to $P_1$ have corresponding circular or stripe shapes. A drain electrode 40 is attached to the bottom of $N^+$ region 10.

In accordance with the invention, the uppermost P regions $P_1$ have a greater diameter then that of the underlying regions $P_2$ to $P_6$, so that the top of the columns will have a greater P charge than that of the surrounding $N_1$ layer. The top-most column may have an increased diameter of only a few percent over that of the lower columns. By way of example, if the lower column elements $P_2$ to $P_6$ have a diameter, after diffusion of 5 microns, the top P region $P_1$ may have a diameter of 5.1 microns (2% greater) to obtain the benefits of the invention.

FIG. 3 shows the implant and diffusion of the top P region $P_1$. Thus, the layer $N_1$ is deposited atop layer $N_2$ and its P regions $P_2$. A mask 50 is then formed atop layer $N_1$ with windows 51, 52 aligned with the center of region $P_2$. A boron or other P species implant and diffusion is then carried out to form the enlarged diameter regions $P_1$ aligned to the tops of the P columns. However, the window diameter for windows 51 and 52 are larger than the implant windows in the mask for regions $P_2$ to $P_6$, creating the enlarged diameter top region $P_1$. Alternately, the diffusion process is carried out for a longer period of time to form enlarged regions $P_1$.

While the windows 51 and 52 are circular (FIG. 2), other shapes can be used for windows 51 and 52, such as elongated stripes, rectangles, ovals, or circles with projecting fingers, and the like to produce a larger P volume at the top of each column. In addition, regions $P_1$ need not be formed on every column over region $P_2$. Some column may include a $P_1$ region that is the same size as region $P_2$ or other regions in the P columns. These columns may be interspersed throughout the semiconductor device to obtain particular characteristics for the device.

Further, while the description above contemplates identical diameters (or widths) for P regions $P_2$ to $P_6$, they may be continuously tapered or stepped down in diameter from a larger diameter for regions $P_2$ to a smaller diameter for regions $P_6$. In addition, a number of upper P regions may be enlarged to some extent, and be in charge imbalance with the surrounding N type material. For example, the topmost two or three P regions may be enlarged in comparison to the lower P regions, and be in charge imbalance with the surrounding N type material.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A method for forming a superjunction device on a substrate having a first conductivity type, the method comprising:
   forming a plurality of horizontal first layers of semiconductor material over the substrate, the first layers of semiconductor material being of the first conductivity type, wherein a first layer of said plurality of horizontal first layers is below a second layer of said plurality of horizontal first layers; and
   diffusing semiconductor material of a second conductivity type in a plurality of vertically aligned regions on each of the first and second layers, the plurality of vertically aligned regions forming spaced pylons whose widths are narrower than a distance between two adjacent pylons, wherein the vertically aligned regions of the second layer are laterally wider than the vertically aligned regions of the first layer, and wherein a plurality of respective top surfaces of the vertically aligned regions of the second layer are below active regions of the superjunction device.

2. The method of claim 1, wherein the first conductivity type is N-type and the second conductivity type is P-type.

3. The method of claim 1, wherein the dimensions of the vertically aligned regions of the second layer are approximately 2% greater than dimensions of the vertically aligned regions of the first layers.

4. The method of claim 3, wherein the vertically aligned regions of the second layer are out of charge balance with a region surrounding the pylon.

5. The method of claim 3, wherein the vertically aligned regions of the first layer are in charge balance with the region surrounding the pylon.

6. The method of claim 1, wherein the pylon has a substantially cylindrical shape.

7. The method of claim 1, wherein the superjunction device has improved avalanche capability.

8. The method according to claim 1, further comprising forming a MOSgated structure atop the second layer, the MOSgated structure having a source contact in a source region, a gate electrode in a channel region positioned above and in contact with a pylon, and a major electrode on a bottom of the substrate.

9. A method for forming a superjunction device having improved avalanche capability, the method comprising:
   forming a layer of semiconductor material on a substrate, the substrate and the layer being of N-type conductivity and comprises a plurality of horizontal portions, wherein a first portion of said plurality of horizontal portions is below a second portion of said plurality of horizontal portions;
   diffusing semiconductor material of P-type conductivity in a plurality of vertically aligned regions in the layer, the plurality of vertically aligned regions forming spaced pylons whose widths are narrower than a distance between two adjacent pylons and length equals that of the width of the layer,
   wherein an area of each pylon farthest from the substrate and constituting a portion of the total area of the pylon, are laterally wide than the rest of the pylon, wherein a top surface of the area of each pylon farthest from the substrate is below an associated active region of the superjunction device.

10. The method of claim 9, wherein the area of each pylon farthest from the substrate and constituting the portion of the total area of the pylon is out of charge balance with a region surrounding the pylon while the rest of the pylon is in charge balance with the region surrounding the pylon.

11. The method of claim 9, wherein the portion is about 10% to 20%.

12. The method of claim 9, wherein the pylon has a substantially cylindrical shape.

13. A method for forming a superjunction device, comprising:
   providing a substrate having one conductivity type;
   overlaying the substrate with a semiconductor material having the same conductivity type to form a first layer comprising a plurality of horizontal portions, wherein a first portion of said plurality of horizontal portions is below a second portion of said plurality of horizontal portions;
   diffusing a semiconductor material of the other conductivity type into the first layer to form a first implant;
   forming a second layer over the first layer having the one conductivity type;
   diffusing a semiconductor material of the other conductivity type into the second layer to form a second implant laterally wider than that of the first implant, wherein a first portion of the semiconductor material of the other conductivity type forms a first pylon whose width is narrower than a distance between the first pylon and a second portion of the semiconductor material of the other conductivity type forming a second pylon, wherein a top surface of the semiconductor material of the other conductivity type diffused into the second layer is below an active region of the superjunction device.

14. The method of claim 13, further comprising:
   forming a MOSgated structure atop the topmost diffusion and having a source and channel region; and
   forming a source contact over the source region;
   forming a gate electrode over the channel region.

15. The method of claim 13, wherein the one conductivity type is N-type and the other conductivity type is P-type.

16. The method of claim 13, wherein dimensions of the second implant second layer are approximately 2% greater than dimensions of the first implant of the first layer.

17. The method of claim 16, wherein the second implant of the second layer are out of charge balance with a region surrounding the pylon.

18. The method of claim 16, wherein the first implant of the first layer is in charge balance with the region surrounding the first pylon.

19. The method of claim 13, wherein the first pylon has a substantially cylindrical shape.

20. The method of claim 13, wherein the superjunction device has improved avalanche capability.

* * * * *